US009018514B2

(12) United States Patent
Kim et al.

(10) Patent No.: US 9,018,514 B2
(45) Date of Patent: Apr. 28, 2015

(54) COOLING SHEET FOR PHOTOVOLTAIC MODULES, METHOD OF MANUFACTURING THE SAME AND PHOTOVOLTAIC MODULES INCLUDING THE SAME

(75) Inventors: Hyun Cheol Kim, Daejeon (KR); Je Sik Jung, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/527,062

(22) Filed: Jun. 19, 2012

(65) Prior Publication Data

US 2013/0019946 A1 Jan. 24, 2013

(30) Foreign Application Priority Data

Jun. 20, 2011 (KR) ........................ 10-2011-0059487

(51) Int. Cl.
| | |
|---|---|
| H01L 31/042 | (2014.01) |
| H01L 31/00 | (2006.01) |
| B32B 17/02 | (2006.01) |
| B32B 27/20 | (2006.01) |
| H01L 31/052 | (2014.01) |
| C08L 33/02 | (2006.01) |

(52) U.S. Cl.
CPC ............. H01L 31/0521 (2013.01); *Y02E 10/50* (2013.01); *C08L 33/02* (2013.01)

(58) Field of Classification Search
None
See application file for complete search history.

(56) References Cited

U.S. PATENT DOCUMENTS

| 6,606,823 B1 * | 8/2003 | McDonough et al. ......... 47/65.9 |
| 7,985,919 B1 * | 7/2011 | Roscheisen et al. .......... 136/246 |
| 2005/0097828 A1 * | 5/2005 | Hasse ................................ 52/60 |
| 2007/0000537 A1 * | 1/2007 | Leidholm et al. ............. 136/252 |
| 2008/0255531 A1 * | 10/2008 | Ring et al. .................... 604/368 |
| 2012/0227793 A1 * | 9/2012 | Meier et al. ................... 136/251 |

FOREIGN PATENT DOCUMENTS

| JP | 2000-022193 A | 1/2000 |
| WO | 0208540 A1 | 1/2002 |
| WO | WO 0208540 A1 * | 1/2002 |

* cited by examiner

*Primary Examiner* — Peter Y Choi
*Assistant Examiner* — Christine Rea
(74) *Attorney, Agent, or Firm* — McKenna Long & Aldridge, LLP

(57) ABSTRACT

A cooling sheet for photovoltaic modules, a method of manufacturing the same, a backsheet for photovoltaic modules, a method of manufacturing the same, and a photovoltaic module are provided. The cooling sheet for photovoltaic modules which includes a resin layer can be prepared by coating or impregnating one surface of a porous substrate with a superabsorbent polymer (SAP) containing a fluid. Here, the resin layer includes the fluid-containing SAP which is formed on one surface of the porous substrate or impregnated with the porous substrate. When the cooling sheet for photovoltaic modules is attached to the outside of the weather-resistant substrate to prepare the backsheet for photovoltaic modules, it is possible to suppress an increase in power generation temperature of a photoelectric cell by evaporation of the fluid, for example water, included in the SAP, thereby improving the power generation efficiency of the photovoltaic module.

23 Claims, 5 Drawing Sheets

COOLING SHEET FOR PHOTOVOLTAIC MODULES, METHOD OF MANUFACTURING THE SAME AND PHOTOVOLTAIC MODULES INCLUDING THE SAME

CROSS-REFERENCE TO RELATED APPLICATION

This application claims priority to and the benefit of Korean Patent Application No. 10-2011-0059487, filed Jun. 20, 2011, the disclosure of which is incorporated herein by reference in its entirety.

BACKGROUND

1. Technical Field

This disclosure relates to a cooling sheet for photovoltaic modules, a method of manufacturing the same, a backsheet for photovoltaic modules, a method of manufacturing the same, and a photovoltaic module including the cooling sheet or backsheet.

2. Related Art

Recently, there has been increasing interest in new regenerable energy and clean energy because of global environmental problems and exhaustion of fossil fuels. Among these, attention has been paid to solar photovoltaic energy as a representative clean energy source that can solve the problems of environmental pollution and exhaustion of fossil fuels.

A photoelectric cell to which the principle of solar photovoltaic power generation is applied is a device that converts sunlight into electric energy and is prepared in a unit type by performing various types of packaging processes for protecting the cell, since it will be exposed to external environments for a long period of time to facilitate absorption of the sunlight, and the said unit is called a photovoltaic module.

In order to enhance the efficiency of a photovoltaic module, it is generally desirable for the photovoltaic module to absorb a great deal of sunlight through a surface thereof. However, when the photovoltaic module absorbs a great deal of sunlight, the output value of the photoelectric cell itself decreases due to the increase in power generation temperature of the photoelectric cell, thereby reducing the entire efficiency of the photovoltaic module. Therefore, it is necessary to suppress an increase in power generation temperature of the photoelectric cell so as to improve the efficiency of the photovoltaic module.

In recent years, in order to effectively emit heat from the photovoltaic module, there have been attempts to improve the efficiency of the photovoltaic module by mounting a separate cooling pin made of an aluminum metal on a backsheet for the photovoltaic module. However, this leads to an additional increase in material cost and installation fee.

Therefore, in the related field, there is a demand for development of a photovoltaic module having a simple structure in which efficiency is improved by effectively suppressing the increase in power generation temperature of the photoelectric cell and also reducing the production costs.

SUMMARY

The present invention is directed to providing a cooling sheet for photovoltaic modules, a method of manufacturing the same, a backsheet for photovoltaic modules, a method of manufacturing the same, and a photovoltaic module including the cooling sheet or backsheet.

One aspect of the present invention provides a cooling sheet for photovoltaic modules, which includes a resin layer including a super-absorbent polymer (SAP) that contains a fluid.

Another aspect of the present invention provides a cooling sheet for photovoltaic modules, which includes a porous substrate impregnated with a SAP containing a fluid.

Still another aspect of the present invention provides a method of manufacturing a cooling sheet for photovoltaic modules, which includes mixing a SAP and a fluid to prepare a SAP containing a fluid and coating one surface of a porous substrate with the fluid-containing SAP to form a resin layer.

Still another aspect of the present invention provides a method of manufacturing a cooling sheet for photovoltaic modules, which includes coating one surface of a porous substrate with a solution of a SAP and drying the porous substrate to form a resin layer; and immersing the porous substrate having the resin layer formed therein in a fluid.

Still another aspect of the present invention provides a method of manufacturing cooling sheet for photovoltaic modules, which includes impregnating a porous substrate with a solution of a SAP and drying the porous substrate; and immersing the porous substrate impregnated with the SAP in a fluid.

Still another aspect of the present invention provides a backsheet for photovoltaic modules, which includes the cooling sheet for photovoltaic modules.

Still another aspect of the present invention provides a method of manufacturing a backsheet for photovoltaic modules, which includes attaching the cooling sheet for photovoltaic modules according to the exemplary embodiments to one surface of a weather-resistant substrate.

Still another aspect of the present invention provides a method of manufacturing a backsheet for photovoltaic modules, which includes mixing a SAP and a fluid to prepare a SAP containing the fluid, followed by coating one surface of a weather-resistant substrate with the fluid-containing SAP to form a resin layer; and forming a porous substrate on the other surface of the resin layer.

Yet another aspect of the present invention provides a photovoltaic module including the backsheet for photovoltaic modules according to the exemplary embodiments.

BRIEF DESCRIPTION OF THE DRAWINGS

The above and other objects, features and advantages of the present invention will become more apparent to those of ordinary skill in the art by describing in detail the exemplary embodiments thereof with reference to the attached drawings, in which.

DETAILED DESCRIPTION OF EXEMPLARY EMBODIMENTS

Hereinafter, the exemplary embodiments will be described in detail. However, the present invention is not limited to the embodiments disclosed below, but can be implemented in various forms. The following embodiments are described in order to enable those of ordinary skill in the art to embody and practice the present invention.

Although the terms first, second, etc. may be used to describe various elements, these elements are not limited by these terms. These terms are only used to distinguish one element from another. For example, a first element could be termed a second element, and similarly, a second element could be termed a first element, without departing from the scope of exemplary embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

With reference to the appended drawings, the exemplary embodiments will be described in detail below. To aid in understanding the present invention, like numbers refer to like elements throughout the description of the figures, and the description of the same elements will not be reiterated.

The exemplary embodiments are directed to providing a cooling sheet for photovoltaic modules, which includes a resin layer including a super-absorbent polymer (SAP) which contains a fluid.

Hereinafter, the cooling sheet for photovoltaic modules will be described in detail.

Figure 1:
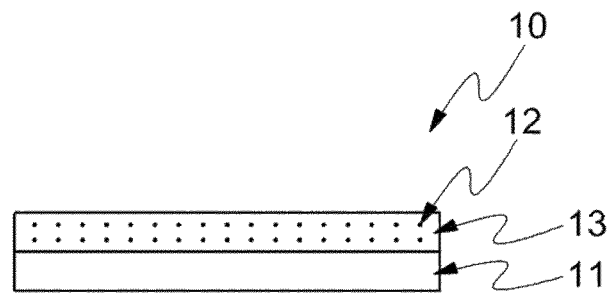
FIGS. 1 to 5 are cross-sectional views showing a cooling sheet for photovoltaic modules according to various exemplary embodiments.
Figure 2:
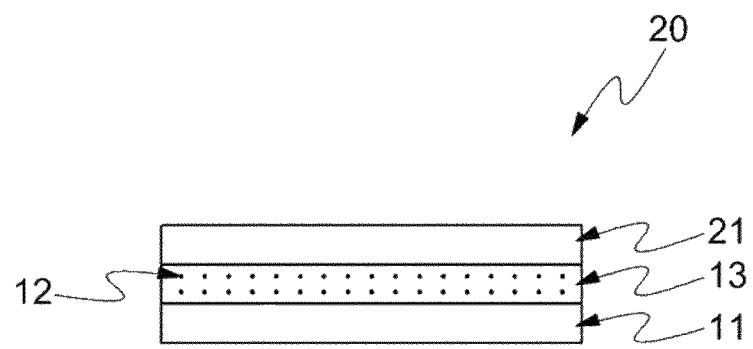

FIGS. 1 and 2 are cross-sectional views showing a cooling sheet for photovoltaic modules according to the exemplary embodiments. As shown in FIG. 1, the cooling sheet 1 for photovoltaic modules according to one exemplary embodiment may be configured to include a porous substrate 11; and a resin layer 13 formed on one surface of the porous substrate 11 and includes a SAP 12 that contains a fluid.

As shown in FIG. 2, the cooling sheet 20 for photovoltaic modules according to another exemplary embodiment may also be configured to include a porous substrate 11; a resin layer 13 formed on one surface of the porous substrate 11 and includes a SAP 12 that contains a fluid; and a porous substrate 21 formed on one surface of the resin layer 13. That is, the cooling sheet 20 for photovoltaic modules may be configured to include the resin layer 13 formed between the two porous substrates 11 and 21 and includes the SAP 12 containing the fluid.

According to still another exemplary embodiment, the resin layer may be a porous substrate which is impregnated with the SAP containing the fluid. That is, the cooling sheet 20 for photovoltaic modules may be configured to include the porous substrate which is impregnated with the SAP containing the fluid.

Figure 3:
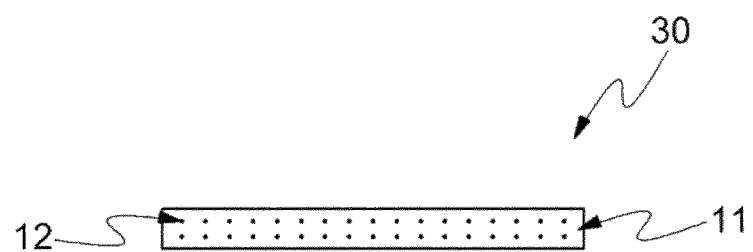
Figure 4:
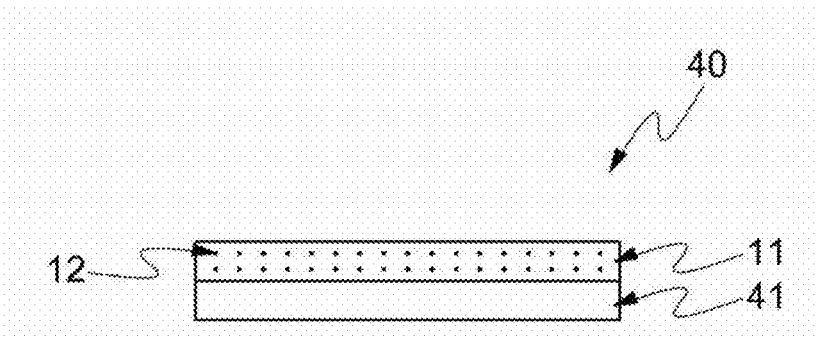
Figure 5:
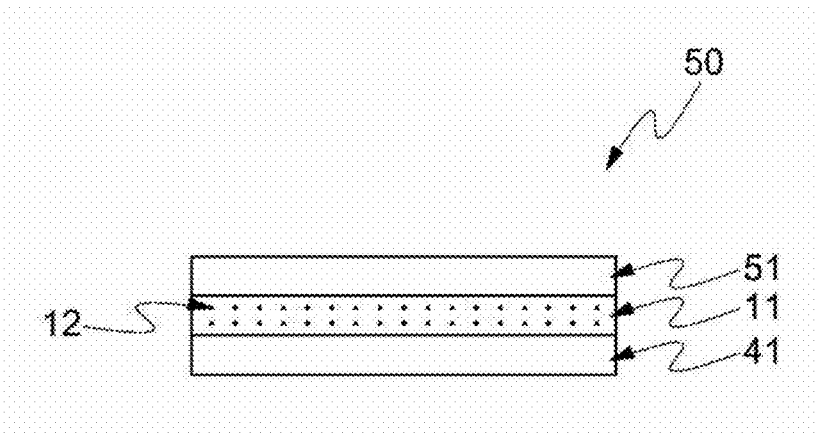

FIGS. 3 to 5 are cross-sectional views showing a cooling sheet for photovoltaic modules according to still another exemplary embodiment. As shown in FIG. 3, the cooling sheet 30 for photovoltaic modules may be configured to include a porous substrate 11 which is impregnated with a SAP 12 containing a fluid.

As shown in FIG. 4, the cooling sheet 40 for photovoltaic modules may also be configured to include a porous substrate 11 impregnated with the SAP 12 containing the fluid; and another porous substrate 41 formed on one surface of the porous substrate 11. As shown in FIG. 5, the cooling sheet 50 for photovoltaic modules may also be configured to include a porous substrate 11 impregnated with the SAP 12 containing the fluid; and other porous substrates 41 and 51 formed on both surfaces of the porous substrate 11.

Since the cooling sheet for photovoltaic modules includes the resin layer including the SAP that contains the fluid, an increase in temperature of the photovoltaic module may be suppressed by emitting heat generated during power generation of the photovoltaic module.

The cooling sheet for photovoltaic modules includes the resin layer including the SAP that contains the fluid. When heat is generated around the resin layer, since the resin layer includes the SAP containing the fluid, the SAP may absorb the heat around the resin layer as the fluid included in the SAP evaporates, and thus function to cool the periphery of the resin layer.

Also, when heat is generated around the porous substrate, the SAP that contains the fluid impregnated into the porous substrate absorbs the heat around the porous substrate as the fluid included in the SAP evaporates. Therefore, the SAP may function to cool the periphery of the porous substrate.

Kinds of the fluid included in the SAP are not particularly limited. However, any fluids may be used without limitation as long as they can absorb the surrounding heat through evaporation. Examples of the fluid may include at least one selected from the group consisting of water, an alcohol and an ionic liquid. More particularly, water may be used in one exemplary embodiment, but the present invention is not limited thereto.

The SAP contains a fluid, but the fluid in the SAP may be released as heat is generated around the resin layer.

Specific kinds of the SAP are not particularly limited. Here, SAPs may be used without limitation as long as they have excellent ability to absorb a fluid. Examples of the SAP may include at least one selected from the group consisting of polyacrylic acid, polyacrylate, a polyacrylate-grafted polymer, starch, crosslinked carboxymethylated cellulose, an acrylic acid copolymer, a hydrolyzed starch-acrylonitrile-grafted copolymer, a starch-acrylic acid-grafted copolymer, a saponified vinyl acetate-acrylic acid ester copolymer, a hydrolyzed acrylonitrile copolymer, a hydrolyzed acrylamide copolymer, an ethylene-maleic anhydride copolymer, an isobutylene-maleic anhydride copolymer, poly(vinyl sulfonate), poly(vinyl phosphonate), poly(vinyl phosphate), poly(vinyl sulfate), sulfonated polystyrene, polyvinyl amine, polydialkylaminoalkyl(meth)acrylamide, polyethyleneimine, polyarylamine, polyaryl guanidine, polydimethyldiarylammonium hydroxide, a quaternized polystyrene derivative, guanidine-modified polystyrene, quaternized poly(meth)acrylamide, polyvinyl guanidine and a mixture thereof. According to one exemplary embodiment, at least one selected from the group consisting of crosslinked polyacrylate, crosslinked polyacrylic acid and a crosslinked acrylic acid copolymer may be used herein, but the present invention is not limited thereto.

Kinds of the acrylic acid copolymer used as the SAP are not particularly limited. For example, the acrylic acid copolymer may be a copolymer including an acrylic acid monomer and at least one copolymer selected from the group consisting of maleic acid, itaconic acid, acrylamide, 2-acrylamide-2-methylpropanesulfonic acid, 2-(meth)acryloyl ethanesulfonic acid, 2-hydroxyethyl(meth)acrylate and styrenesulfonic acid.

The SAP may have a fluid absorption amount, for example a water absorption amount, of 10 g/g to 500 g/g, or 50 g/g to 200 g/g, but the present invention is not limited thereto. That is, 1 g of the SAP may absorb 10 g to 500 g, or 50 g to 200 g of water.

The higher the fluid absorption amount of the SAP is, the more the duration of the cooling effect is improved. However, when the fluid absorption amount exceeds 500 g/g, the fluidity of the SAP may be increased, and thus the SAP may not exert effective cooling due to difficulty in maintaining the shape of the SAP. Also, when the fluid absorption amount of the SAP is less than 10 g/g, it is not effective in applying it to the photovoltaic module due to very short duration of cooling effect.

The cooling sheet for photovoltaic modules may be formed as a separate layer by coating one surface of the porous substrate with the SAP containing the fluid or impregnating the SAP containing the fluid into the porous substrate.

As such, specific kinds of the porous substrate included in the cooling sheet for photovoltaic modules are not particularly limited, but various materials known in the art may be used. For example, the porous substrate that may be used herein may include at least one selected from the group consisting of a nonwoven fabric, a mesh and a foam.

The term "nonwoven fabric" used herein means a fabric prepared in the form of a felt by arranging fibers in a parallel or random direction without performing a weaving process and connecting the fibers using a synthetic resin adhesive.

Also, the term "mesh" used herein means a fabric coarsely woven like a net.

In addition, the term "foam" used herein means a composite material obtained by dispersing a gaseous or liquid foaming agent on a solid material.

More particularly, the porous substrate may include at least one selected from the group consisting of a fluorine-based nonwoven fabric, a polyester-based nonwoven fabric, a polypropylene-based nonwoven fabric, a rayon-based nonwoven fabric, a nylon-based nonwoven fabric, a polyester-based mesh, a polypropylene-based mesh, a rayon-based mesh, a nylon-based mesh and a urethane foam, but the present invention is not limited thereto.

The thickness of the cooling sheet for photovoltaic modules is not particularly limited, but may be properly selected according to applications. For example, the thickness of the cooling sheet for photovoltaic modules may be in the range of 0.1 mm to 100 mm, or 0.1 mm to 10 mm. When the thickness of the cooling sheet for photovoltaic modules is less than 0.1 mm, it is not effective since the time in which the cooling effect can be exerted is very short. When the thickness of the cooling sheet for photovoltaic modules exceeds 100 mm, it is difficult to handle, and the production costs may be increased.

The thickness of the porous substrate is not particularly limited. However, the thickness of the porous substrate may be properly selected according to applications. For example, the thickness of the porous substrate may be in the range of 0.01 mm to 10 mm, or 0.05 mm to 1 mm. When the thickness of the porous substrate is less than 0.01 mm, it is difficult to secure a sufficient mechanical property to support the weight of the SAP. On the other hand, when the thickness of the porous substrate exceeds 10 mm, the production costs may be increased.

According to still another exemplary embodiment, the cooling sheet for photovoltaic modules may further include a thermally conductive filler so as to improve thermal conductivity. For example, the cooling sheet for photovoltaic modules may further include a thermally conductive filler in addition to the porous substrate, the resin layer, or both the porous substrate and the resin layer.

Specific kinds of the thermally conductive filler are not particularly limited. Here, thermally conductive fillers may be used without limitation as long as they have an excellent heat transfer property. Examples of the thermally conductive filler may include at least one selected from the group consisting of inorganic oxide filler, metal hydroxide filler, inorganic carbide filler, nitride filler, metal filler and carbon filler, but the present invention is not limited thereto.

An example of the inorganic oxide filler may include aluminum oxide, magnesium oxide, zinc oxide or silicon oxide, an example of the metal hydroxide filler may include aluminum hydroxide or magnesium hydroxide, an example of the inorganic carbide filler may include silicon carbide, an example of the nitride filler may include aluminum nitride, boron nitride or silicon nitride, an example of the metal filler may include silver, copper, zinc, iron, aluminum, nickel, tin or an alloy thereof, and an example of the carbon filler may include carbon or graphite, but the present invention is not limited thereto.

A specific shape of the thermally conductive filler is not particularly limited. For example, the shape of the thermally conductive filler may include a spherical, fibrous, scaly, planar, pelletized or amorphous shape.

The resin layer may further include a pulp containing a fluid in addition to the SAP containing the fluid.

The pulp containing the fluid may also have the same functions as the SAP containing the fluid. Here, the duration of the cooling effect of the cooling sheet for photovoltaic modules may be improved due to addition of the pulp containing the fluid.

Specific details of the fluid can be understood as already indicated above, and kinds of the pulp are not particularly limited. Here, pulps may be used without limitation as long as they can absorb a fluid, particularly, water.

The content of the pulp containing the fluid included in the resin layer is not particularly limited. For example, the pulp containing the fluid may be included at a content of less than 90 parts by weight, or less than 70 parts by weight, based on 100 parts by weight of the SAP containing the fluid. When the content of the pulp containing the fluid exceeds 90 parts by weight, the cooling efficiency may be reduced.

The term "part(s) by weight" used herein means a weight ratio.

Still another exemplary embodiment is directed to providing a method of manufacturing a cooling sheet for photovoltaic modules, which includes forming a resin layer including a SAP that contains a fluid. A method of forming a resin layer including a SAP may be performed using various methods, and will be described in detail.

By way of example, forming the resin layer may include mixing a SAP and a fluid to prepare a SAP containing the fluid, and coating one surface of a porous substrate with the fluid-containing SAP to form a resin layer.

In order to prepare the cooling sheet for photovoltaic modules, first, a SAP and a fluid may be mixed to prepare a SAP containing the fluid. Specific details of the SAP and the fluid can be understood as already indicated above.

When the SAP and the fluid are mixed, the fluid is absorbed into the SAP, thereby obtaining a sol-state SAP containing the fluid. A mixing ratio of the SAP and the fluid is not particularly limited. In considering the amount of water absorbed by the above-described SAP, the fluid may be mixed at a content of 10 parts by weight to 500 parts by weight, or 50 parts by weight to 200 parts by weight with 1 part by weight of the SAP.

After the sol-state SAP containing the fluid is prepared, one surface of the porous substrate may be coated with the sol-state SAP to form a resin layer. Specific details of the porous substrate can be understood as already indicated above.

A method of coating one surface of the porous substrate with the sol-state SAP containing the fluid is not particularly limited. For example, the coating method may include a known printing method such as offset printing or gravure printing, or a known coating method such as roll coating, bar coating, knife edge coating, gravure coating or doctor blade coating. Therefore, any methods are applicable as long as they can be used to form a uniform resin layer.

In order to fix the resin layer formed on one surface of the porous substrate, the method may also include forming the resin layer, followed by forming a porous substrate on the other surface of the resin layer. A method of forming another porous substrate on the other surface of the resin layer is not particularly limited, and any methods generally used in the art may be applied without limitation. For example, a porous substrate may be further formed on one surface of the resin layer on which the porous substrate is not formed using a lamination process, but the present invention is not limited thereto.

In order to prevent secession of the resin layer formed on the surface of the porous substrate, the method may also include sealing edges of the porous substrate and the resin layer.

A method of sealing the edges of the porous substrate and the resin layer is not particularly limited, and any methods generally used in the art may be applied without limitation. For example, the edges of the porous substrate and the resin layer may be sealed using an adhesive. Also, kinds of the adhesive are not particularly limited. For example, the adhesive that may be used herein may include a urea-based adhesive, a melamine-based adhesive, a phenol-based adhesive, an unsaturated polyester-based adhesive, an epoxy-based adhesive, a resorcinol-based adhesive, a polyvinyl alcohol-based adhesive, a vinyl chloride-based adhesive, an acrylic adhesive, a polyethylene-based adhesive, a polyamide-based adhesive, a polyvinylacetylene-based adhesive or a vinyl acetate-based adhesive. Here, any adhesives are applicable as long as they can seal the edges of the porous substrate and the resin layer.

Another method of forming the resin layer of the cooling sheet for photovoltaic modules includes a method of coating one surface of a porous substrate with a SAP and immersing the porous substrate coated with the SAP in a fluid.

A method of coating one surface of the porous substrate with the SAP which may be used herein may include a variety of methods, for example, a method using a solution including the SAP. For example, a solution of the SAP may be prepared by dispersing the SAP in a solvent.

Kinds of the solvent are not particularly limited. Here, any solvents may be used without limitation as long as they can uniformly disperse the SAP. Examples of the solvent may include at least one selected from the group consisting of methyl ethyl ketone (MEK), dimethylformamide (DMF) and dimethylacetamide (DMAC), but the present invention is not limited thereto.

The content of the solvent is not particularly limited, but may be properly selected in consideration of the content of the SAP used.

A method of dispersing the SAP in the solvent is not particularly limited. Any methods may be used without limitation as long as they can be used to uniformly disperse the SAP in the solvent. For example, stirring or sonication may also be performed so as to disperse the SAP in the solvent, but the present invention is not limited thereto.

The solution of the SAP is prepared, and a surface of the porous substrate is then coated with the solution of the SAP. A method of coating a surface of the porous substrate with the solution of the SAP is not particularly limited. For example, the coating method includes a known printing method such as offset printing or gravure printing, or a known coating method such as roll coating, bar coating, knife edge coating, gravure coating or doctor blade coating. Here, any methods are applicable as long as they can be used to form a uniform coating layer.

As necessary, the method according to one embodiment may also further include drying the porous substrate. A method of drying a surface of the porous substrate after being coated with the solution of the SAP is not particularly limited. Any methods may be used without limitation as long as they can be used to remove solvent components in the solution of the SAP. For example, the porous substrate may be dried in a drying oven to remove the solvent component in the solution of the SAP.

In order to allow the SAP to contain a fluid after coating one surface of the porous substrate with the SAP, the method according to one embodiment may include immersing the porous substrate coated with the SAP in a fluid. In this case, an immersion time may be adjusted to such a time that the SAP can sufficiently contain the fluid. For example, the porous substrate may be immersed for 1 minute to 3 hours, or 5 minutes to 30 minutes.

Also, in order to fix the SAP layer coated on one surface of the porous substrate, the method may further include forming a porous substrate on the other surface of the SAP layer after coating one surface of the porous substrate with the SAP and before immersing the porous substrate in a fluid. A method of forming a porous substrate on the other surface of the SAP layer is not particularly limited, and any methods generally used in the art may be applied without limitation. For example, a porous substrate may be further formed on the other surface of the SAP layer using a lamination process, but the present invention is not limited thereto.

Also, in order to prevent secession of the resin layer formed on one surface of the porous substrate, the method may include sealing edges of the porous substrate and the resin layer.

A method of sealing the edges of the porous substrate and resin layer is not particularly limited, and any methods generally used in the art may be applied without limitation. For example, the edges of the porous substrate and resin layer may be sealed using an adhesive. Also, kinds of the adhesive are not particularly limited. For example, the adhesive that may be used herein may include a urea-based adhesive, a melamine-based adhesive, a phenol-based adhesive, an unsaturated polyester-based adhesive, an epoxy-based adhesive, a resorcinol-based adhesive, a polyvinyl alcohol-based adhesive, a vinyl chloride-based adhesive, an acrylic adhesive, a polyethylene-based adhesive, a polyamide-based adhesive, a polyvinylacetylene-based adhesive or a vinyl acetate-based adhesive. In this case, any adhesives are applicable as long as they can be used to seal the edges of the porous substrate and the resin layer.

Another method of forming the resin layer of the cooling sheet for photovoltaic modules may include impregnating a porous substrate with a solution of a SAP and drying the porous substrate; and immersing the porous substrate impregnated with the SAP in a fluid.

First, the solution of the SAP may be prepared by dispersing a SAP in a solvent. Specific details of the SAP and the solvent can be understood as already indicated above.

After the solution of the SAP is prepared, the porous substrate may be impregnated with the solution of the SAP and dried. A method of preparing the solution of the SAP and impregnating the porous substrate with the solution of the SAP is not particularly limited. Any methods may be used without limitation as long as they enable the solution of the SAP to easily penetrate the porous substrate. For example, the porous substrate may be impregnated with the solution of the SAP by immersing the porous substrate in the solution of the SAP, but the present invention is not limited thereto.

A method of impregnating the porous substrate with the solution of the SAP and drying the porous substrate is not particularly limited. Any methods may be used without limitation as long as they can be used to remove solvent components in the solution of the SAP. For example, the porous substrate may be dried in a drying oven to remove the solvent components in the solution of the SAP.

Thereafter, in order to allow the SAP impregnated into the porous substrate to contain a fluid, the method may include immersing the porous substrate impregnated with the SAP in a fluid. In this case, an immersion time may be adjusted to such a time that the SAP can sufficiently contain the fluid. For example, the porous substrate may be immersed for 1 minute to 3 hours, or 5 minutes to 30 minutes.

In order to fix the SAP impregnated into the porous substrate, the method according to one embodiment may also further include forming a porous substrate on one or both surfaces of the porous substrate impregnated with the SAP before or after impregnating the porous substrate with the SAP and immersing the porous substrate in a fluid.

A method of forming another porous substrate on one or both surfaces of the porous substrate impregnated with the SAP is not particularly limited, and any methods generally used in the art may be applied without limitation. For example, another porous substrate may be further formed on the other surface of the porous substrate using a lamination process, but the present invention is not limited thereto.

Also, in order to prevent secession of the SAP impregnated into the porous substrate, the method according to one embodiment may include sealing the edges of the porous substrates.

A method of sealing the edges of the porous substrates is not particularly limited, but any methods generally used in the art may be applied without limitation. For example, the edges of the porous substrates may be sealed using an adhesive.

Also, kinds of the adhesive are not particularly limited. For example, the adhesive that may be used herein may include a urea-based adhesive, a melamine-based adhesive, a phenol-based adhesive, an unsaturated polyester-based adhesive, an epoxy-based adhesive, a resorcinol-based adhesive, a polyvinyl alcohol-based adhesive, a vinyl chloride-based adhesive, an acrylic adhesive, a polyethylene-based adhesive, a polyamide-based adhesive, a polyvinylacetylene-based adhesive or a vinyl acetate-based adhesive. In this case, any adhesives are applicable as long as they can be used to seal the edges of the porous substrates.

Still another exemplary embodiment is directed to providing a backsheet for photovoltaic modules including the cooling sheet for photovoltaic modules. According to one exemplary embodiment, the backsheet for photovoltaic modules includes a weather-resistant substrate; and a cooling sheet for photovoltaic modules formed on one surface of the weather-resistant substrate. In this case, the weather-resistant substrate is disposed at a side of the photovoltaic module, and the cooling sheet may be disposed toward an outside of the photovoltaic module, and then applied to the photovoltaic module.

Figure 6:
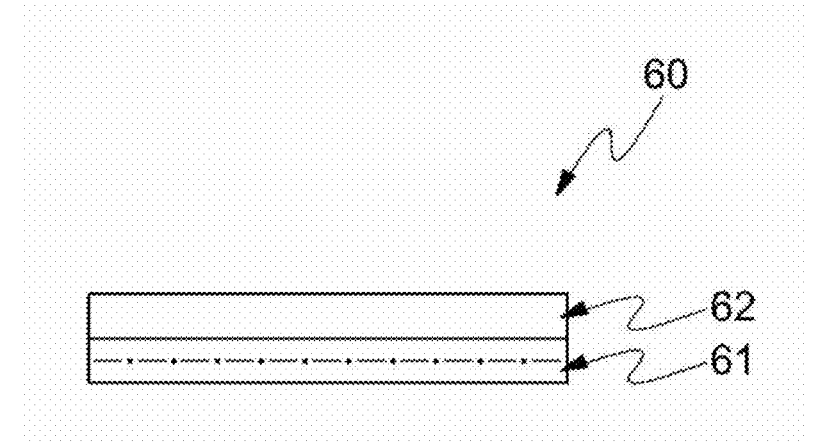
FIG. 6 is a cross-sectional view showing a backsheet for photovoltaic modules according to one exemplary embodiment.

FIG. 6 is a cross-sectional view showing a backsheet for photovoltaic modules according to one exemplary embodiment. As shown in FIG. 6, the backsheet 60 for photovoltaic modules may be configured to include a weather-resistant substrate 61; and a cooling sheet 62 for photovoltaic modules formed on one surface of the weather-resistant substrate 61.

When the weather-resistant substrate included in the backsheet for photovoltaic modules according to the exemplary embodiments is applied to the photovoltaic module, the weather-resistant substrate is not particularly limited as long as it serves to give weather resistance and durability when the photovoltaic module is exposed to external environments for a long time. For example, the weather-resistant substrate may be at least one selected from the group consisting of a fluorine-based weather-resistant substrate, a polyethylene terephthalate (PET)-based weather-resistant substrate and a polyamide-based weather-resistant substrate. Also, the weather-resistant substrate may have a multilayer structure including a plurality of layers made of different materials, as necessary.

In order to improve thermal conductivity of the backsheet for photovoltaic modules, the weather-resistant substrate may further include a thermally conductive filler.

Specific kinds of the thermally conductive filler are not particularly limited. Here, any thermally conductive fillers may be used without limitation as long as they have an excellent heat transfer property. Examples of the thermally conductive filler may include at least one selected from the group consisting of an inorganic oxide filler, a metal hydroxide filler, an inorganic carbide filler, a nitride filler, a metal filler and a carbon filler, but the present invention is not limited thereto.

Examples of the inorganic oxide filler may include aluminum oxide, magnesium oxide, zinc oxide or silicon oxide, examples of the metal hydroxide filler may include aluminum hydroxide or magnesium hydroxide, an example of the inorganic carbide filler may include silicon carbide, examples of the nitride filler may include aluminum nitride, boron nitride or silicon nitride, examples of the metal filler may include silver, copper, zinc, iron, aluminum, nickel, tin or an alloy thereof, and examples of the carbon filler may include carbon or graphite, but the present invention is not limited thereto.

A specific shape of the thermally conductive filler is not particularly limited. For example, the shape of the thermally conductive filler may include a spherical, fibrous, scaly, planar, pelletized or amorphous shape.

The thickness of the weather-resistant substrate is not particularly limited, but may be properly selected according to applications. For example, the thickness of the weather-resistant substrate may be in the range of 10 μm to 1,000 μm, or 50 μm to 500 μm. When the thickness of the weather-resistant substrate is less than 10 μm, it is difficult to secure the sufficient mechanical property and low moisture permeability, whereas, when the thickness of the weather-resistant substrate exceeds 1,000 μm, it is difficult to handle, and the production costs may be increased.

The backsheet for photovoltaic modules according to the exemplary embodiments includes a cooling sheet for photovoltaic modules formed on one surface of the weather-resistant substrate together with the weather-resistant substrate. Specific details of the cooling sheet for photovoltaic modules included in the backsheet for photovoltaic modules can be understood as already indicated above.

The backsheet for photovoltaic modules according to the exemplary embodiments includes the above-described cooling sheet for photovoltaic modules. Therefore, an increase in power generation temperature of the photoelectric cell may be suppressed, thereby improving the efficiency of the photovoltaic module.

Still another exemplary embodiment is directed to providing a method of manufacturing a backsheet for photovoltaic modules, which includes attaching the above-described cooling sheet for photovoltaic modules according to the exemplary embodiments to one surface of the weather-resistant substrate.

In order to prepare the backsheet for photovoltaic modules, the above-described cooling sheet for photovoltaic modules may be attached to one surface of the weather-resistant substrate. Specific details of the weather-resistant substrate and the cooling sheet for photovoltaic modules can be understood as already indicated above.

A method of attaching the cooling sheet for photovoltaic modules to one surface of the weather-resistant substrate is not particularly limited. Any methods may be used without limitation as long as they can be used to firmly attach the cooling sheet for photovoltaic modules to one surface of the weather-resistant substrate. For example, the cooling sheet for photovoltaic modules may be attached to one surface of the weather-resistant substrate using an adhesive, but the present invention is not limited thereto. Also, kinds of the adhesive are not particularly limited. For example, the adhesive that may be used herein may include a urea-based adhesive, a melamine-based adhesive, a phenol-based adhesive, an unsaturated polyester-based adhesive, an epoxy-based adhesive, a resorcinol-based adhesive, a polyvinyl alcohol-based adhesive, a vinyl chloride-based adhesive, an acrylic adhesive, a polyethylene-based adhesive, a polyamide-based adhesive, a polyvinylacetylene-based adhesive or a vinyl acetate-based adhesive. Here, any adhesives may be used as long as they can be used to attach the cooling sheet for photovoltaic modules to one surface of the weather-resistant substrate.

Still another exemplary embodiment is directed to providing a method of manufacturing a backsheet for photovoltaic modules, which includes mixing a SAP and a fluid to prepare a SAP containing the fluid and coating one surface of the weather-resistant substrate with the fluid-containing SAP to form a resin layer; and forming another porous substrate on the other surface of the resin layer.

That is, in order to manufacture the backsheet for photovoltaic modules sequentially including the weather-resistant substrate, the super-absorbent resin layer and the porous substrate, first, the SAP and the fluid maybe mixed to prepare a SAP containing the fluid.

When the SAP is mixed with the fluid, the fluid may be absorbed into the SAP to obtain a sol-state SAP containing the fluid. A mixing ratio of the SAP and the fluid is not particularly limited. However, the fluid may be mixed at a content of 10 parts by weight to 500 parts by weight, or 50 parts by weight to 200 parts by weight with 1 part by weight of the SAP in considering the amount of water absorbed by the above-described SAP.

After the sol-state SAP containing the fluid is prepared, a resin layer may be formed by coating one surface of the weather-resistant substrate with the fluid-containing sol-state SAP.

A method of coating one surface of the weather-resistant substrate with the fluid-containing sol-state SAP is not particularly limited. For example, the coating method may include a known printing method such as offset printing or gravure printing, or a known coating method such as roll coating, bar coating, knife edge coating, gravure coating or doctor blade coating. Therefore, any methods are applicable as long as they can be used to form a uniform resin layer.

Thereafter, the method may include forming another porous substrate on the other surface of the super-absorbent resin layer which is coated on one surface of the weather-resistant substrate.

A method of forming a porous substrate on a surface of the resin layer is not particularly limited, but any methods generally used in the art may be applied without limitation. For example, in order to form the porous substrate on an opposite surface of the resin layer that does not come in contact with the weather-resistant substrate, a lamination process may be used herein, but the present invention is not limited thereto.

Also, in order to prevent secession of the resin layer formed on one surface of the weather-resistant substrate, the method may include sealing the edges of the weather-resistant substrate, the resin layer and the porous substrate.

A method of sealing the edges of the porous substrate and the resin layer is not particularly limited, but any methods generally used in the art may be applied without limitation. For example, the edges of the porous substrate and the resin layer may be sealed using an adhesive. Also, kinds of the adhesive are not particularly limited. For example, the adhesive that may be used herein may include a urea-based adhesive, a melamine-based adhesive, a phenol-based adhesive, an unsaturated polyester-based adhesive, an epoxy-based adhesive, a resorcinol-based adhesive, a polyvinyl alcohol-based adhesive, a vinyl chloride-based adhesive, an acrylic adhesive, a polyethylene-based adhesive, a polyamide-based adhesive, a polyvinylacetylene-based adhesive or a vinyl acetate-based adhesive. In this case, any adhesives may be applied as long as they can be used to seal the edges of the weather-resistant substrate, the resin layer and the porous substrate.

Yet another exemplary embodiment is directed to providing a photovoltaic module including the above-described backsheet for photovoltaic modules.

A structure of the photovoltaic module is not particularly limited as long as the photovoltaic module includes the backsheet for photovoltaic modules according to the exemplary embodiments. A variety of structures of the photovoltaic module generally known in the art may be applied without limitation.

For example, the structure of the photovoltaic module may include a backsheet for photovoltaic modules; a photoelectric cell or photoelectric cell array formed on the backsheet; a light-receiving sheet formed on the photoelectric cell or photoelectric cell array; and an encapsulating material layer configured to encapsulate the photoelectric cell or photoelectric cell array between the backsheet and the light-receiving sheet.

The above-described backsheet according to the exemplary embodiments may be used in the photovoltaic module. In this case, the thickness of the backsheet is not particularly limited. For example, the thickness of the backsheet may be in the range of 30 μm to 2,000 μm, 50 μm to 1,000 μm, or 100 μm to 600 μm. When the thickness of the backsheet is controlled to the range of 30 μm to 2,000 μm, excellent physical properties such as weather resistance of the photovoltaic module may be maintained while forming a thinner photovoltaic module.

Specific kinds of the photoelectric cell formed on the backsheet are not particularly limited as long as they can induce a photoelectromotive force. Therefore, any photoelectric element generally used in the art may be used herein. For example, a crystalline silicon photoelectric cell formed of monocrystalline silicon or polycrystalline silicon, an amorphous silicon photoelectric cell having a single junction or tandem structure, a Group III-V compound semiconductor photoelectric cell formed of gallium-arsenic (GaAs) or indium-phosphorus (InP), and a Group II-VI compound semiconductor photoelectric cell formed of cadmium-tellurium (CdTe) or copper-indium-selenide ($CuInSe_2$) may be used as the photoelectric cell. Also, a thin-film polycrystalline silicon photoelectric cell, a thin-film amorphous silicon photoelectric cell and a hybrid photoelectric cell of thin-film crystalline silicon and amorphous silicon may also be used herein.

The photoelectric cell may form a photoelectric cell array (a photoelectric cell assembly) using wires connecting a photoelectric cell to another photoelectric cell. When the photovoltaic module is illuminated with sunlight, electrons (−) and holes (+) are generated inside the photoelectric cell, and an electric current flows through the wires connecting the photoelectric cell to another photoelectric cell.

The light-receiving sheet formed on the photoelectric cell or photoelectric cell array may function to protect the inside of the photovoltaic module from wind, rain, external impact or fire and secure the long-term reliability even when the photovoltaic module is exposed to the outside. Specific kinds of the light-receiving sheet are not particularly limited as long as they have excellent light transmissibility, electrical insulating property, and mechanical, physical or chemical strength. For example, a glass plate, a fluorine-based resin sheet, a cyclic polyolefin-based resin sheet, a polycarbonate-based resin sheet, a poly(meth)acrylic resin sheet, a polyamide-based resin sheet or a polyester-based resin sheet may be used as the light-receiving sheet. A glass plate having excellent heat resistance may be used in one exemplary embodiment, but the present invention is not limited thereto.

The thickness of the light-receiving sheet is not particularly limited, but may be, for example, in the range of 0.5 mm to 10 mm, 1 mm to 8 mm, or 2 mm to 5 mm. When the thickness of the light-receiving sheet is controlled to a range of 0.5 mm to 10 mm, excellent physical properties such as long-term reliability of the photovoltaic module may be maintained while forming a thinner photovoltaic module.

Also, the encapsulating material layer configured to encapsulate the photoelectric cell or photoelectric cell array inside the photovoltaic module, more particularly, between the backsheet and the light-receiving sheet, may be formed using an encapsulating material generally known in the art without limitation.

Figure 7:
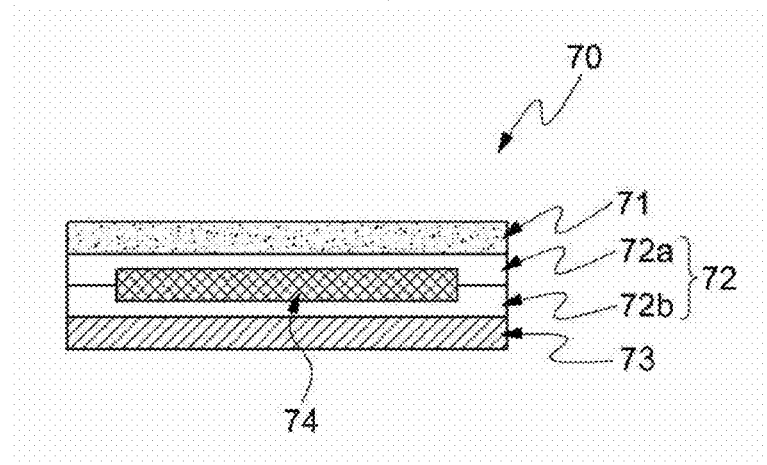
FIGS. 7 and 8 are cross-sectional views showing a photovoltaic module according to various exemplary embodiments.
Figure 8:
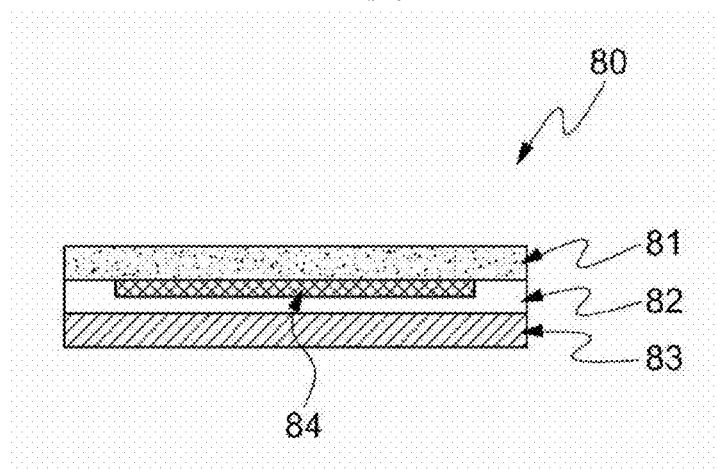

FIGS. 7 and 8 are cross-sectional views showing a photovoltaic module according to various exemplary embodiments.

FIG. 7 is a diagram showing one example of a wafer-based photovoltaic module 70 including the backsheet for photovoltaic modules. As shown in FIG. 7, the photovoltaic module according to one exemplary embodiment may include a light-receiving sheet 71 generally formed of a ferroelectric material (for example, glass); the above-described backsheet for photovoltaic modules 73; a photoelectric element 74 such as a silicon-based wafer; and an encapsulating material layer 72 configured to encapsulate the photoelectric element 74. In this case, the encapsulating material layer 72 may include a first layer 72a attached to the light-receiving sheet 71 while encapsulating the photoelectric element 74, and a second layer 72b attached to the backsheet 73 while encapsulating the photoelectric element 74. According to the exemplary embodiments, the first and second layers constituting the encapsulating material layer 72 may be formed of a material generally known in the art, as described above.

FIG. 8 is a cross-sectional view showing a thin-film photovoltaic module 80 according to another exemplary embodiment. In the case of the thin-film photovoltaic module 80, a photoelectric element 84 may be generally formed on a light-receiving sheet 81 that may be formed of a ferroelectric material, as shown in FIG. 8. Such a thin-film photoelectric element 84 may be typically deposited using a method such as chemical vapor deposition (CVD). Like the photovoltaic module 20 shown in FIG. 7, the photovoltaic module 80 shown in FIG. 8 includes an encapsulating material layer 82 and a backsheet 83, and the encapsulating material layer 82 may be configured in a single layer. Specific details of the encapsulating material layer 82 and the backsheet 83 can be understood as already indicated above.

A method of manufacturing such a photovoltaic module is not particularly limited, and the photovoltaic module may be manufactured using a variety of methods known in the art without limitation.

The photovoltaic module shown in FIGS. 7 and 8 is merely one of various examples of the photovoltaic module according to the exemplary embodiments, and the structure of a module, and the kind and size of a material constituting the module are not particularly limited as long as the photovoltaic module includes the above-described backsheet for photovoltaic modules according to the exemplary embodiments. Therefore, any photovoltaic modules generally known in the art may be applied without limitation.

EXAMPLES

Hereinafter, the present invention will be described in further detail with reference to Examples which fall within the scope of the present invention and Comparative Examples which do not fall within the scope of the present invention. However, it should be understood that the description proposed herein is merely a preferable example for the purpose of illustration only, not intended to limit the scope of the invention.

Example 1

Preparation of SAP Containing Fluid 5 g of an acrylic copolymer (GS-4700 commercially available from LG Chemicals) as a SAP and 500 g of water as a fluid were mixed to prepare a sol-state solution of a SAP containing water.

Formation of Resin Layer

A polyester-based nonwoven fabric (CF909, commercially available from Seoul Semitech) having a thickness of 0.37 mm was coated with the prepared water-containing sol-state solution of the SAP, using a doctor blade, so that a coating thickness could amount to 10 mm, thereby forming a resin layer.

Preparation of Cooling Sheet for Photovoltaic Modules

A polyester-based nonwoven fabric having a thickness of 0.37 mm (CF909 commercially available from Seoul Semitech) was attached to a surface of the formed resin layer using a double-sided adhesive tape, and a cooling sheet for photovoltaic modules was prepared by sealing edges of the resin layer and the polyester-based nonwoven fabric that is a porous substrate so as to prevent secession of the SAP.

Example 2

A backsheet for photovoltaic modules was manufactured by attaching the cooling sheet for photovoltaic modules prepared in Example 1 to a weather-resistant substrate (LBS-CF commercially available from LG Chemicals) using a double-sided adhesive tape.

Example 3

Figure 9:
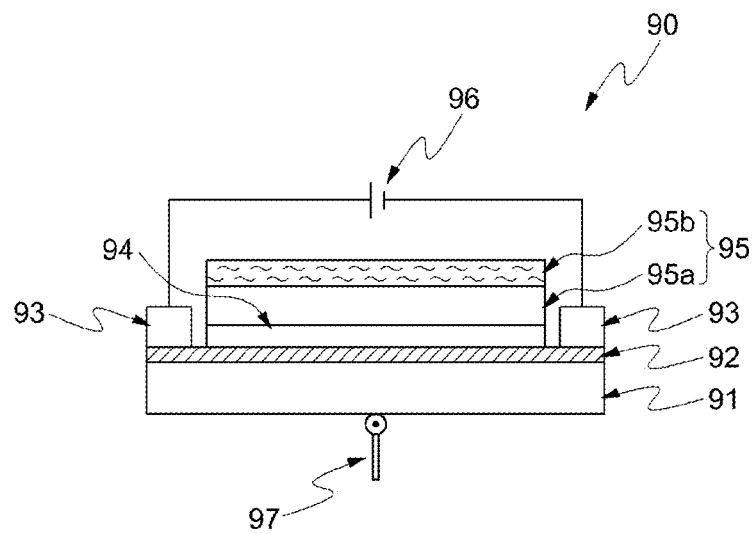
FIG. 9 is a cross-sectional view showing a test sample of Example 3 including the cooling sheet according to one exemplary embodiment.

In order to determine the cooling effect of the cooling sheet 95b for photovoltaic modules prepared in Example 1, a test sample shown in FIG. 9 was prepared. More particularly, as shown in FIG. 9, a conductive tape 93 was attached to both edges of an electrode surface 92 of ITO glass 91 having an ITO transparent electrode 92 coated on one surface thereof, a portion of a weather-resistant substrate 95a of the backsheet 95 for photovoltaic modules prepared in Example 2 was attached to a central region of the electrode surface 92 of the ITO glass 91 using a double-sided adhesive tape 94, and a power supply device 96 was connected to the conductive tape 93 attached to both edges of an electrode surface 92 so as to provide a power supply. In order to measure a change in temperature of the ITO glass according to a change in voltage, a contact thermometer 97 acting in a thermocouple mode was then connected to a central region of an electrodeless surface of the ITO glass 91 to prepare a test sample 90 including the cooling sheet.

Comparative Example 1

Figure 10:
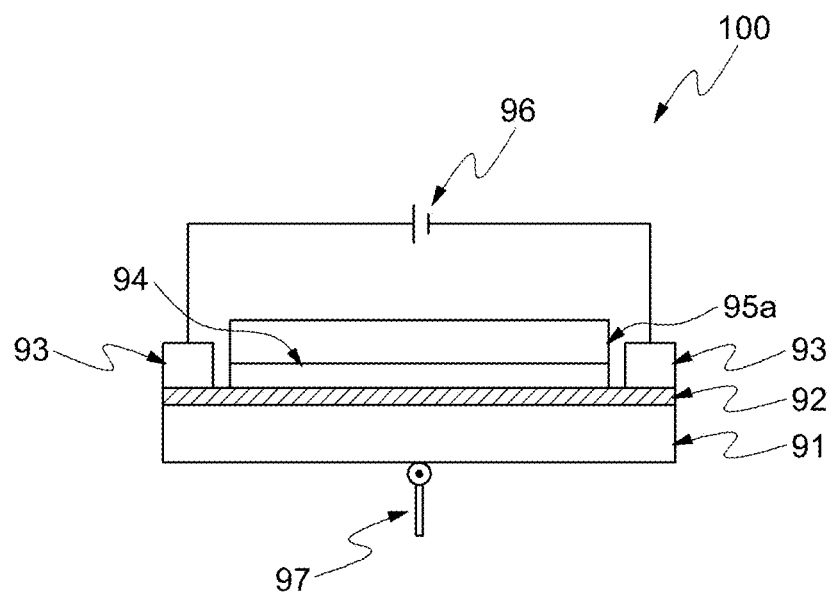
FIG. 10 is a cross-sectional view showing a test sample of Comparative Example 1, which does not include the cooling sheet.

A test sample shown in FIG. 10 was prepared in the same manner as in Example 3, except that a weather-resistant substrate (LBS-CF commercially available from LG Chemicals) which did not include the cooling sheet was used instead of the backsheet for photovoltaic modules prepared in Example 2. More particularly, as shown in FIG. 10, a conductive tape 93 was attached to both edges of an electrode surface 92 of ITO glass 91 having an ITO transparent electrode 92 coated on one surface thereof, a weather-resistant substrate 95a was attached to a central region of the electrode surface 92 of the ITO glass 91 using a double-sided adhesive tape 94, and a power supply device 96 was connected to the conductive tape 93 attached to both edges of the electrode surface 92 so as to provide a power supply. In order to measure a change in temperature of the ITO glass according to a change in voltage, a contact thermometer 97 acting in a thermocouple mode was then connected to a central region of an electrodeless surface of the ITO glass 91 to prepare a test sample 90 which did not include the cooling sheet.

Example 4

Figure 11:
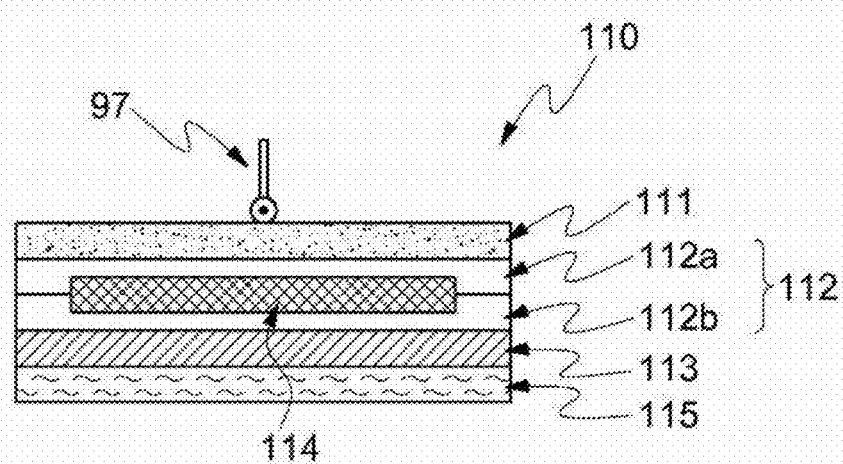
FIG. 11 is a cross-sectional view showing a photovoltaic module including the cooling sheet according to one exemplary embodiment.

A photovoltaic module including the cooling sheet was prepared, as shown in FIG. 11. More particularly, as shown in FIG. 11, a photovoltaic module, which included a light-receiving sheet 111 formed of glass; a weather-resistant substrate (LBS-CF commercially available from LG Chemicals) 113; a photoelectric cell array 114 obtained by connecting four photoelectric cells composed of silicon-based wafers in series; and an encapsulating material layer 112 configured to encapsulate the photoelectric cell array 114, was prepared, and the cooling sheet 115 for photovoltaic modules prepared in Example 1 was attached to one surface of the weather-resistant substrate 113 to manufacture a photovoltaic module 110. In this case, the encapsulating material layer 112 included an upper encapsulating material 112a attached to the light-receiving sheet 111 while encapsulating the photoelectric cell array 114 and a lower encapsulating material 112b attached to the weather-resistant substrate 113 while encapsulating the photoelectric cell array 114, and EVA for photovoltaic modules (F406 commercially available from Hangzhou First) was used as the encapsulating material layer. In order to measure a change in temperature, a contact thermometer 97 acting in a thermocouple mode was also attached to a central region of the light-receiving sheet 111.

Comparative Example 2

A photovoltaic module was manufactured in the same manner as in Example 4, except that the cooling sheet for photovoltaic modules was not attached to a surface of the weather-resistant substrate.

The changes in temperature of the test samples and the photovoltaic modules prepared in the Examples and Comparative Examples were measured, as follows.

1. Measurement of Changes in Temperature of Test Samples of Example 3 and Comparative Example 1

In the test samples prepared in Example 3 and Comparative Example 1, an electric current was fixed to 10 A using a power supply device, a voltage was changed and set to 10 V, 15 V, 20 V and 25 V, and a voltage maintenance time was 5 minutes. In this case, a contact thermometer acting in a thermocouple mode, which was attached to a central region of the electrodeless surface of the ITO glass, was used to measure temperatures of the test samples at respective voltages. In this case, the ambient temperature of the test samples was maintained at 27° C.

Figure 12:
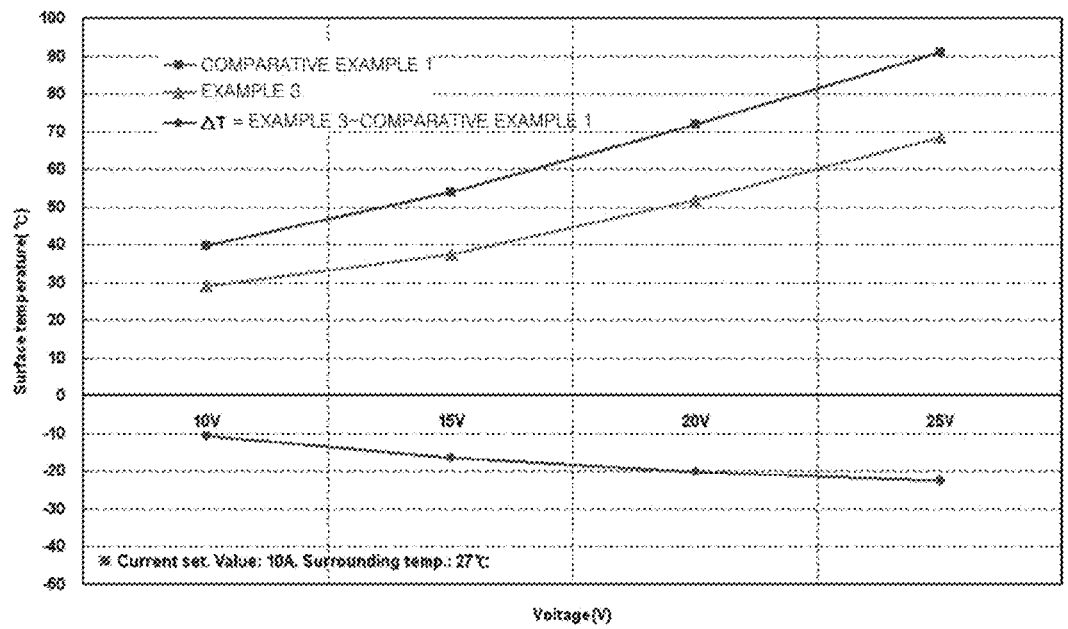
FIG. 12 is a graph showing changes in temperature of test samples prepared in Example 3 and Comparative Example 1 according to a change in voltage.

FIG. 12 is a graph showing the changes in temperature of the test samples prepared in Example 3 and Comparative Example 1 according to a change in voltage. The results obtained from the graph of FIG. 12 are listed in the following Table 1.

TABLE 1

| | Voltage | | |
| --- | --- | --- | --- |
| | 10 V | 15 V | 20 V |
| Example 3 (° C.) | 29.0 | 37.4 | 51.9 |
| Comparative Example 1 (° C.) | 39.8 | 53.9 | 72.0 |
| ΔT | −10.8 | −16.5 | −20.1 |

ΔT: Temperature of Example 3 − Temperature of Comparative Example 1

As listed in Table 1, it was revealed that the test sample of Comparative Example 1 which did not include the cooling sheet had a temperature of approximately 40° C. at a voltage of 10 V and the test sample of Example 3 including the cooling sheet had a temperature of approximately 29° C. at a voltage of 10 V, indicating a cooling effect of approximately 11° C. Also, it was revealed that the test sample of Comparative Example 1 had a temperature of approximately 72° C. at a voltage of 20 V and the test sample of Example 3 had a temperature of approximately 52° C. at a voltage of 20 V, indicating a cooling effect of approximately 20° C.

In general, since a temperature coefficient of the crystalline photovoltaic module was approximately 0.5, it could be seen that, when the power generation temperature of the photovoltaic module was in the range of approximately 40° C. to 70° C., the efficiency of the photovoltaic module was improved by approximately 5% to 10% using the cooling sheet.

2. Measurement of Changes in Temperature of Test Samples of Example 4 and Comparative Example 2

The solar photovoltaic power generation was carried out using the photovoltaic modules prepared in Example 4 and Comparative Example 2. In order to measure the changes in temperature of the photovoltaic modules of Example 4 and Comparative Example 2 during the solar photovoltaic power generation, a contact thermometer acting in a thermocouple mode, which was attached to a central region of the light-receiving sheet formed of glass, was used. In this case, the changes in temperature were measured for 8 hours spanning from 09:30 to 17:30, the weather was bright and sunny, and the ambient temperature was maintained at approximately 30° C.

Figure 13:
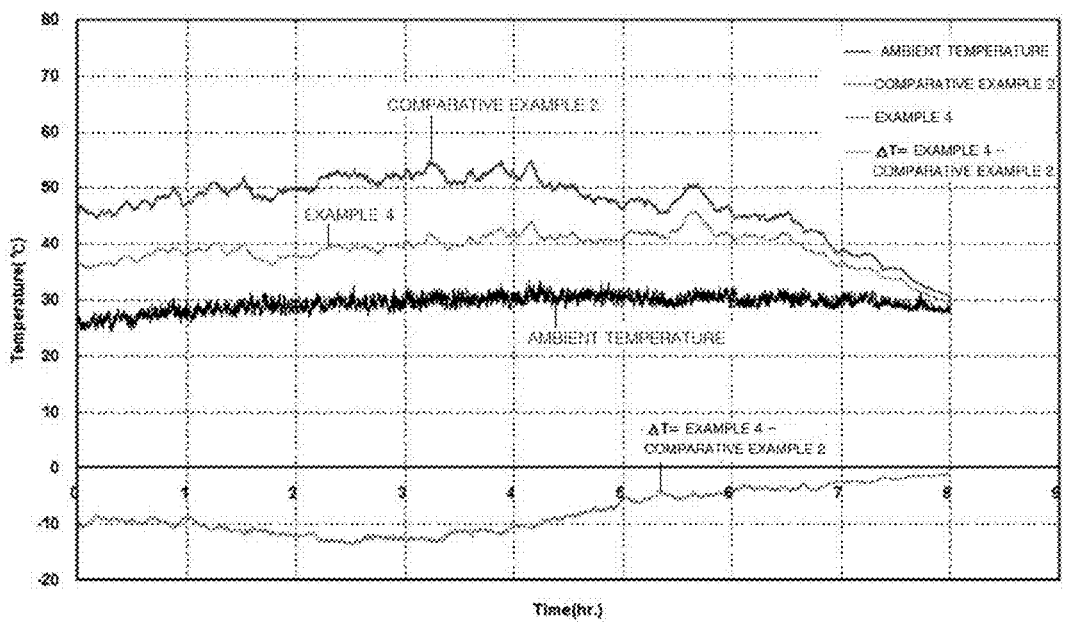
FIG. 13 is a graph showing changes in temperature of photovoltaic modules prepared in Example 4 and Comparative Example 2 according to the change in solar photovoltaic power generation.

FIG. 13 is a graph showing the changes in temperature of the photovoltaic modules prepared in Example 4 and Comparative Example 2 according to the change in solar photovoltaic power generation. As shown in FIG. 12, when the ambient temperature was maintained at approximately 30° C., the power generation temperature of the photovoltaic module was maintained at approximately 50° C. in the case of the test sample of Comparative Example 2 which did not include the cooling sheet, and the power generation temperature of the photovoltaic module was maintained at approximately 40° C. in the case of the test sample of Example 4 including the cooling sheet.

That is, it could be seen that the photovoltaic module including the cooling sheet shows an effect of suppressing an increase in power generation temperature by approximately 10° C., compared to the photovoltaic module that does not include the cooling sheet, indicating that the efficiency of the photovoltaic module is improved by approximately 5% in consideration that a temperature coefficient of the crystalline photovoltaic module is 0.5.

When the cooling sheet for photovoltaic modules according to the exemplary embodiments is applied to the outside of the weather-resistant substrate and then used as the backsheet for photovoltaic modules, the cooling sheet, which includes a resin layer including a SAP that contains a fluid, can suppress an increase in power generation temperature of the photovoltaic module by evaporation of the fluid, for example water, included in the SAP during power generation of the photovoltaic module, thereby improving the power generation efficiency of the photovoltaic module.

While the invention has been shown and described with reference to certain exemplary embodiments thereof, it will be understood by those skilled in the art that various changes in form and details may be made therein without departing from the scope of the invention as defined by the appended claims.

What is claimed is:

1. A cooling sheet for photovoltaic modules comprising:
a resin layer including a super-absorbent polymer (SAP) which contains a fluid, and a thermally conductive filler;
wherein the fluid is an alcohol;
wherein the cooling sheet formed on the photovoltaic modules emits heat generated from the photovoltaic modules to suppress an increase in the temperature of the photovoltaic modules;
wherein an evaporation of the fluid contained in the super-absorbent polymer (SAP) absorbs and cools heat generated from the photovoltaic modules.

2. The cooling sheet for photovoltaic modules of claim 1, wherein the resin layer is a coating layer formed on one surface of a porous substrate.

3. The cooling sheet for photovoltaic modules of claim 1, wherein the resin layer is a porous substrate impregnated with the SAP containing the fluid.

4. The cooling sheet for photovoltaic modules of claim 1, further comprising a porous substrate formed on one or both surfaces of the resin layer.

5. The cooling sheet for photovoltaic modules of claim 1, in which the edges of the resin layer are sealed.

6. The cooling sheet for photovoltaic modules of claim 1, wherein the SAP has a water absorption amount of 10 g/g to 500 g/g.

7. The cooling sheet for photovoltaic modules of claim 1, wherein the SAP is at least one selected from the group consisting of polyacrylic acid, polyacrylate, a polyacrylate-grafted polymer, starch, crosslinked carboxymethylated cellulose, an acrylic acid copolymer, a hydrolyzed starch-acrylonitrile-grafted copolymer, a starch-acrylic acid-grafted copolymer, a saponified vinyl acetate-acrylic acid ester copolymer, a hydrolyzed acrylonitrile copolymer, a hydrolyzed acrylamide copolymer, an ethylene-maleic anhydride copolymer, an isobutylene-maleic anhydride copolymer, poly(vinyl sulfonate), poly(vinyl phosphonate), poly(vinyl phosphate), poly(vinyl sulfate), sulfonated polystyrene, polyvinyl amine, polydialkylaminoalkyl(meth)acrylamide, polyethyleneimine, polyarylamine, polyaryl guanidine, polydimethyldiarylammonium hydroxide, a quaternized polystyrene derivative, guanidine-modified polystyrene, quaternized poly(meth)acrylamide, polyvinyl guanidine and a mixture thereof.

8. The cooling sheet for photovoltaic modules of claim 1, wherein the cooling sheet has a thickness of 0.1 mm to 100 mm.

9. The cooling sheet for photovoltaic modules of claim 2, wherein the porous substrate is at least one selected from the group consisting of a nonwoven fabric, a mesh and a foam.

10. The cooling sheet for photovoltaic modules of claim 9, wherein the porous substrate is at least one selected from the group consisting of a fluorine-based nonwoven fabric, a polyester-based nonwoven fabric, a polypropylene-based nonwoven fabric, a rayon-based nonwoven fabric, a nylon-based nonwoven fabric, a polyester-based mesh, a polypropylene-based mesh, a rayon-based mesh, a nylon-based mesh and a urethane foam.

11. The cooling sheet for photovoltaic modules of claim 2, wherein the porous substrate has a thickness of 0.01 mm to 10 mm.

12. The cooling sheet for photovoltaic modules of claim 3, wherein the porous substrate is at least one selected from the group consisting of a nonwoven fabric, a mesh and a foam.

13. The cooling sheet for photovoltaic modules of claim 1, wherein the super-absorbent (SAP) has a water absorption amount of 50 g/g to 200 g/g.

14. The cooling sheet for photovoltaic modules of claim 2, wherein the porous substrate further includes a thermally conductive filler.

15. The cooling sheet for photovoltaic modules of claim 1 or 14, wherein the thermally conductive filler is at least one selected from the group consisting of an inorganic oxide filler, a metal hydroxide filler, an inorganic carbide filler, a nitride filler, a metal filler and a carbon filler.

16. The cooling sheet for photovoltaic modules of claim 1, wherein the resin layer further comprises a pulp containing the fluid.

17. A method of manufacturing the cooling sheet for photovoltaic modules defined in claim 1, comprising:
   forming a resin layer including a super-absorbent polymer (SAP) which contains a fluid, and a thermally conductive filler.

18. The method of claim 17, wherein the forming of the resin layer includes:
   mixing a SAP, a fluid and a thermally conductive filler to prepare a SAP containing the fluid, followed by coating one surface of a porous substrate with the fluid-containing SAP to form a resin layer.

19. The method of claim 17, wherein the forming of the resin layer comprises:
   coating one surface of a porous substrate with a SAP and a thermally conductive filler; and
   immersing the porous substrate coated with the SAP and the thermally conductive filler in a fluid.

20. The method of claim 17, wherein the forming of the resin layer comprises:
   impregnating a porous substrate with a solution of a SAP and a thermally conductive filler, drying the porous substrate and impregnating the porous substrate with the SAP and the thermally conductive filler; and
   immersing the porous substrate impregnated with the SAP and the thermally conductive filler in a fluid.

21. The method of claim 18, further comprising:
   forming a porous substrate on the other surface of the resin layer.

22. The method of claim 19, further comprising:
   forming a porous substrate on the other surface of the resin layer after the coating of one surface of the porous substrate with the SAP.

23. The method of claim 20, further comprising:
   forming a porous substrate on one or both surfaces of the porous substrate after impregnating the porous substrate with the solution of the SAP and drying the porous substrate.

* * * * *